United States Patent [19]

Matsumoto et al.

[11] Patent Number: 5,465,148
[45] Date of Patent: Nov. 7, 1995

[54] APPARATUS AND METHOD FOR DETECTING THE RELATIVE POSITIONAL DEVIATION BETWEEN TWO DIFFRACTION GRATINGS

[75] Inventors: Takahiro Matsumoto; Noriyuki Nose; Kenji Saito, all of Atsugi; Koichi Sentoku, Kanagawa, all of Japan

[73] Assignee: Canon Kabushiki Kaisha, Tokyo, Japan

[21] Appl. No.: 139,143

[22] Filed: Oct. 21, 1993

[30] Foreign Application Priority Data

Oct. 23, 1992 [JP] Japan .................................. 4-309700

[51] Int. Cl.⁶ .................................................. G01B 9/02
[52] U.S. Cl. ........................ 356/349; 356/356; 356/363
[58] Field of Search .................................. 356/351, 349, 356/354, 356, 363; 250/237 G

[56] References Cited

U.S. PATENT DOCUMENTS

| | | | |
|---|---|---|---|
| 4,298,283 | 11/1981 | Makosch et al. | 356/349 |
| 4,577,968 | 3/1986 | Makosch | 356/356 |
| 5,142,156 | 8/1992 | Ozawa et al. . | |
| 5,148,037 | 9/1992 | Suda et al. . | |
| 5,182,615 | 1/1993 | Kurosawa et al. . | |
| 5,200,800 | 4/1993 | Suda et al. . | |
| 5,225,892 | 7/1993 | Matsugu et al. . | |

FOREIGN PATENT DOCUMENTS 64-82624  3/1989  Japan .

*Primary Examiner*—Samuel A. Turner
*Attorney, Agent, or Firm*—Fitzpatrick, Cella, Harper & Scinto

[57] ABSTRACT

A first Savart plate and an object to be measured are arranged on the light path of a Zeeman light source. The object to be measured is constructed of a diffraction grating on a mask and a diffraction grating on a wafer. A second Savart plate, a deflection plate and a photoelectric detector are sequentially arranged in the light path for the diffracted beams from the measured object. The output of the photoelectric detector is connected to a phase-difference unit to detect the phase difference between two beat signals. Herein, the light is split into two beams by the Savart plate. After a diffraction is caused by the diffraction gratings, thereafter, the beams are re-synthesized by the Savart plates. The two beams travel on the same light path, thereby improving a measurement accuracy.

16 Claims, 14 Drawing Sheets

PRIOT ART

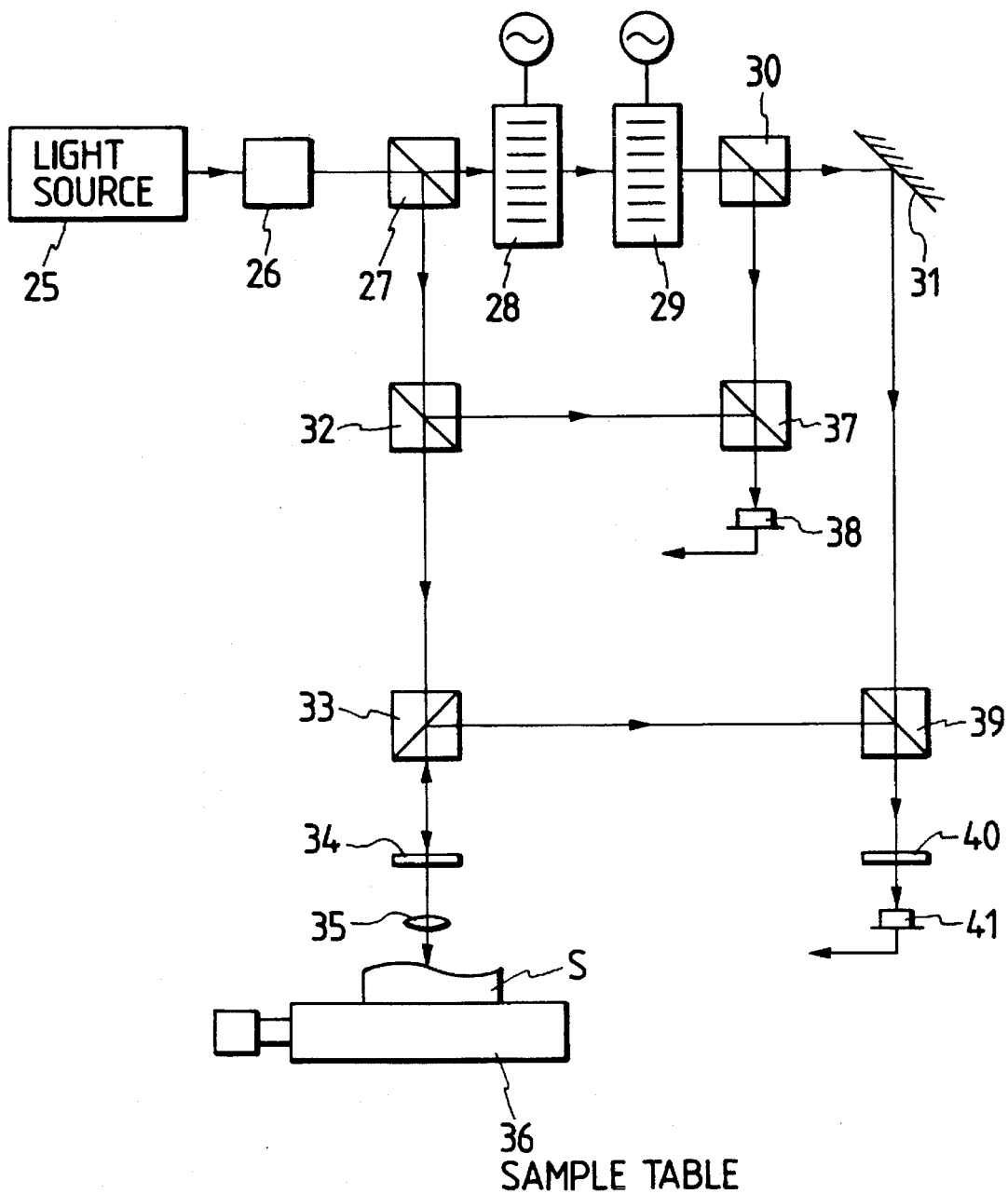

APPARATUS AND METHOD FOR DETECTING THE RELATIVE POSITIONAL DEVIATION BETWEEN TWO DIFFRACTION GRATINGS

BACKGROUND OF THE INVENTION

1. Field of the Invention

The present invention relates to an interferometric measuring method and an interferometric measuring apparatus applied to, e.g., an apparatus for aligning a mask with a wafer and an overlay accuracy measuring apparatus or a surface configuration measuring apparatus.

2. Related Background Art

FIG. 16 is a view illustrating the construction of a first conventional example. Shown therein is an alignment apparatus based on an optical heterodyne method using rectilinear diffraction gratings as alignment marks which are disclosed in Japanese Patent Laid-Open Application No. 64-82624. A diffraction grating 2 and a mirror 3 are arranged on the light path of a 2-wavelength rectilinear polarizing laser light source 1. An illumination optical system 4 is provided in the reflecting direction of the mirror 3. A mask 6 disposed on a mask stage 5 and a wafer 8 disposed on a wafer stage 7 are provided in the transmitting direction of the illumination optical system 4. Beams of light from the illumination optical system 4 are incident on a diffraction grating 9 formed on the mask 6 and a diffraction grating 10 formed on the wafer at an angle determined by the NA (Numerical Aperture) thereof.

Further, a polarized beam splitter 11 is provided in the reflecting direction of the diffraction gratings 9, 10. A knife edge 12 and a detecting means 13 are provided in the reflecting direction of the polarized beam splitter 11. The diffracted beam from the diffraction grating 9 is cut off by the knife edge 12 so that the light does not fall on the detecting means 13. A knife edge 14 and a detecting means 15 are provided in the transmitting direction of the polarized beam splitter 11. The diffracted beam from the diffraction grating 10 is cut off by the knife edge 14 so that the light does not fall on the detecting means 15. Further, outputs of the detecting means 13, 15 are connected to a phase-difference unit 16. An output of the phase-difference unit 16 is connected to a wafer stage driving circuit 17 and a mask stage driving circuit 18. An output of the wafer stage driving circuit 17 is also connected to the wafer stage 7. An output of the mask stage driving circuit 18 is connected to the mask stage 5.

A beam of light L1 emitted from the 2-wavelength rectilinear polarizing laser light source 1 is incident on the diffraction grating 2. Beams L2, L3, L4 from the diffraction grating 2 are deflected by the mirror 3. A 0th-order diffracted beam L3, a + first-order diffracted beam L2 and a − first-order diffracted beam L4 pass through the illumination optical system 4, and thereafter, any one of these diffracted beams is cut off. One of two other diffracted beams is changed in terms of its polarizing direction by means of a λ/2 plate, whereby the diffraction gratings 9, 10 are irradiated with this beam. A diffracted beam L5 is reflection-diffracted by the diffraction grating 10. A diffracted beam L6 is reflection-diffracted by the diffraction grating 9. The diffracted beams L5, L6 travel in the same direction. However, the positions of the diffraction gratings 10, 9 slightly deviate in the y-direction as shown in FIG. 17. Hence, the diffracted beams L5, L6 do not overlap but are slightly separated.

The diffracted beam L5 is split into two beams by the polarized beam splitter 11. The transmitted beam is, however, cut off by the knife edge 14 and is not therefore detected. Only the reflected beam is detected by the detecting means 13. Similarly, only the transmitted beam in the diffracted beam L6 is detected by the detecting means 15. The phase difference between the respective beat signals is detected by the phase-difference unit 16 from the outputs of the detecting means 13, 15.

FIGS. 18 and 19 are explanatory views showing the first conventional example where the mask 6 is aligned with the wafer 8. A synthesized beam Em of the − first-order diffracted beam having a frequency f1 and the + first-order diffracted beam having a frequency f2 is expressed by the following formula:

$$Em = A1 \cdot \exp\{i \cdot (2\pi \cdot f1 \cdot t - \delta m)\} + A2 \cdot \exp\{i \cdot (2\pi \cdot f \cdot t + \delta m)\} \quad (1)$$

where $\delta m$ is the x-directional displacement from the fiducial position in the diffraction grating 9 and is given by $\delta m = 2\pi \cdot \Delta Xm/P$. Note that P is the pitch of the diffraction gratings 9, 10.

The beam intensity Im of the synthesized beam Em expressed by the formula (1) is given by the following formula:

$$Im = |Em|^2 = A1^2 + A2^2 + 2A1 \cdot A2 \cdot \cos\{2\pi \cdot (f1-f2) \cdot t - 2\delta m\} \quad (2)$$

The phase of the optical beat signal given by the formula (2) changes by a variation $4\pi \cdot \Delta Xm/P$ of a component expressed by the third term in the formula (2) which is produced when the diffraction grating 9 moves by $\Delta Xm$.

The value of the pitch P of the diffraction gratings 9, 10 is already known. It is therefore possible to detect the moving quantity $\Delta Xm$ of the diffraction grating 9 by detecting the phase change of the optical beat signal.

Similarly, the moving quantity $\Delta Xw$ of the diffraction grating 10 on the wafer 8 is also detectable. An optical beat signal Iw detected by the second detecting means 1 is defined as a beam intensity of the synthesized beams of the + first-order diffracted beam having the frequency f1 and the − first-order diffracted beam having the frequency f2. The optical beat signal Iw is expressed by the following formula:

$$Iw = A_1^2 + A_2^2 + 2A1 \cdot A2 \cdot \cos\{2\pi \cdot (f1-f2) \cdot t - 2\delta w\} \quad (3)$$

where $\delta w = 2\pi \cdot \Delta Xw/P$.

Further, the following is a formula to express the phase difference $\Delta \phi$ between the optical signal detected by the detecting means 13 which is expressed by the formula (2) and the optical beat signal detected by the detecting means 15 which is expressed by the formula (3).

$$\Delta \phi = 4\pi \cdot (\Delta Xm - \Delta Xw)/P \quad (4)$$

Detected in this way is the phase difference between the beat signal of the mask diffracted beam and the beat signal of the wafer diffracted beam. The mask stage 5 and the wafer stage 7 are moved relative to each other by the wafer stage driving circuit 17 and the mask stage driving circuit 18 so that the phase difference is zero. The mask is thereby precisely aligned with the wafer.

Further, the alignment performance of the assembled apparatus as an exposure apparatus is actually measured and evaluated. For this purpose, the hyperfine patterns formed on the mask have hitherto been overlay-printed on the wafer. The deviation quantity between the on-wafer patterns is measured. A well-known vernier measuring method is employed, as illustrated in, e.g., FIG. 18, so-so that called vernier patterns are exposure-formed on the wafer, and the deviation quantity therebetween is observed by enlarging the patterns through a microscope, etc..

That is, FIGS. 20, 21, and 22 are explanatory views each showing, e.g., resist patterns exposed on the wafer. The resist patterns exist on the portions indicated by oblique lines. Note that these figures show the means for measuring only a deviation in the x-axis direction. At this time, patterns 21, 22 constitute a vernier. One graduation of the vernier is equivalent to 0.055 μm. To start with, an exposure on the wafer is performed through a second mask (reticle), thereby forming the pattern 21. Next, the resist is coated thereon, and the second mask (reticle) formed with the pattern 22 is aligned with the wafer. Thereafter, the exposure is effected to form the pattern 22.

After this formation, as a result of the alignment, there is measured a degree of error with which the first mask (reticle) and the second mask (reticle) are overlaid. This measurement involves such a step that, as shown in FIG. 20, the vernier patterns on the wafer on which both of the patterns 21, 22 are printed are observed by enlarging them through the microscope and are then read. For example, referring to FIGS. 20 to 22, a pitch of the patterns 21 may be set to 7.95 μm, while a pitch of the patters 22 may be set to 8.00 μm.

Further, FIG. 23 shows a third conventional example by showing a surface configuration measuring apparatus to which the optical heterodyne method is applied. A collimator lens 26, a polarized beam Splitter 27, acoustic optical elements 28, 29, a beam Splitter 30 and a mirror 31 are sequentially arranged on the light path of a light source 25. Besides, a beam splitter 32, a polarized beam splitter 33, a λ/4 plate 34, an objective lens 35 and a sample table 36 are sequentially arranged in the reflecting direction of the polarized beam splitter 27. An object S to be measured is placed on the sample table 36. A polarized beam splitter 37 is further provided in the reflecting direction of the beam splitters 30, 32. A photoelectric detector 38 is provided on the light path for the two synthesized beams. A polarized beam splitter 39 is also provided in the reflecting direction of the polarized beam splitter 33. A polarizing plate 40 and a photoelectric detector 41 are arranged on the light path for the two synthesized beams.

Beams emitted from the light source 25 are split by the polarized beam splitter 27, depending on the difference in their of polarizing components. One beam is frequency-modulated by the acoustic optical elements 28, 29 and subsplit into two beams by the beam splitter 30. This reflected beam is synthesized by the polarized beam splitter 37 with the beam reflected by the polarized beam splitter 27 and the beam splitter 32. This is detected by the photoelectric detector 38, and a reference beat signal is generated.

On the other hand, the beam penetrating the beam splitter 32 travels through the polarized beam splitter 33 and the λ/4 plate 34 as well. The transmitted beam is condensed by the objective lens 35 and falls on the surface of the object S to be measured. The beam reflected by the surface again penetrates the objective lens 35. At this time, this beam penetrates the λ/4 plate 34 twice, whereby the polarizing direction is turned through 90 degrees. The beam is thus reflected by the polarized beam splitter 33. This beam is synthesized with the beam penetrating the beam splitter 30 by means of the polarized beam splitter 39. The synthesized beams are rearranged in terms of their polarizing direction by the polarizing plate 40 and interfered with each other. This interference signal is detected by the photoelectric detector 41, thereby obtaining a measurement beat signal. The rugged configuration on the surface of the object S to be measured is measured based on the phase difference between the reference beat signal and the measurement beat signal.

SUMMARY OF THE INVENTION

In the first conventional example, automation of the measurement is simplified. However, it is required that the diffraction gratings defined as alignment marks be made as small as possible at the utilizing level. At this time, the diffracted beams respectively from the diffraction gratings are split and led to separate sensors. The diffracted beams spread even in such a case and overlap in the knife edge position. This, an error is caused due to a cross-talk.

There also arises a problem inherent in the second conventional example, wherein the measurement is hard to automate, and to perform method this requires a good deal of human labor.

Furthermore, the third conventional example has such the problem that the light path for the two beams interfering with each other has many non-common portions. Thus, disturbances such as an air disturbance are readily encountered. As a result, the desired accuracy can not be obtained.

Accordingly, it is a primary object of the present invention, which overcomes the defects inherent in the conventional examples given above, to provide an interferometric measuring method and an interferometric measuring apparatus that are capable of facilitating the automation and setting of an optical system and enhancing measurement accuracy.

To accomplish the object described above, according to a certain aspect of the interferometric measuring method of the present invention, the geometry of an optical system is such that a Savart plate and a surface to be measured are so disposed as to be conjugate. Two beams having frequencies different from each other and their polarization planes orthogonal to each other are incident on the Savart plate. Beam spots of the two beams are formed in positions slightly apart from each other on the surface to be measured. The beams from the substance to be measured undergo at least one of reflection, diffraction, refraction and scattering. Such beams are re-synthesized by the Savart plate so provided as to be conjugate to the measured surface or another Savart plate. The beams are interfere with each other, thereby generating a beat signal. Relative information on the measured substance between the two beam spot positions is detected based on a phase of the beat signal.

Further, according to a certain aspect of the interferometric measuring apparatus of the present invention, the apparatus includes a means for generating two rectilinear polarized beams having frequencies slightly different from each other and their polarization planes orthogonal to each other. The apparatus also includes a projection system comprising a Savart plate and a first imaging optical system in which the Savart plate and an object to be measured are so disposed as to be optically conjugate. The apparatus further includes a light receiving system comprising a second imaging optical system, a polarizing plate and a photoelectric converting element for generating a beat signal by converting interference beams into an electrical signal. The apparatus still further includes a means for detecting phase information or frequency information of the beat signal.

According to the interferometric measuring method and apparatus of the present invention, the two beams having the slightly different frequencies and their polarization planes orthogonal to each other are split by the Savart plate. The reflected beams, diffracted beams, refracted beams and scattered beams from the object to be measured are re-synthesized by the Savart plate disposed in the position conjugate to the surface to be measured and the lens as well. The beams are thereafter interfere with each other, whereby the light path for the two beams is made common.

BRIEF DESCRIPTION OF THE DRAWINGS

Other objects and advantages of the present invention will become apparent during the following discussion in conjunction with the accompanying drawings, in which:

FIG. 23 is a view showing a construction in the conventional example;

DESCRIPTION OF THE PREFERRED EMBODIMENTS

<Embodiment 1>

The present invention will hereinafter be described in detail by way of illustrative embodiments with reference to FIGS. 1 to 15.

Figure 1:
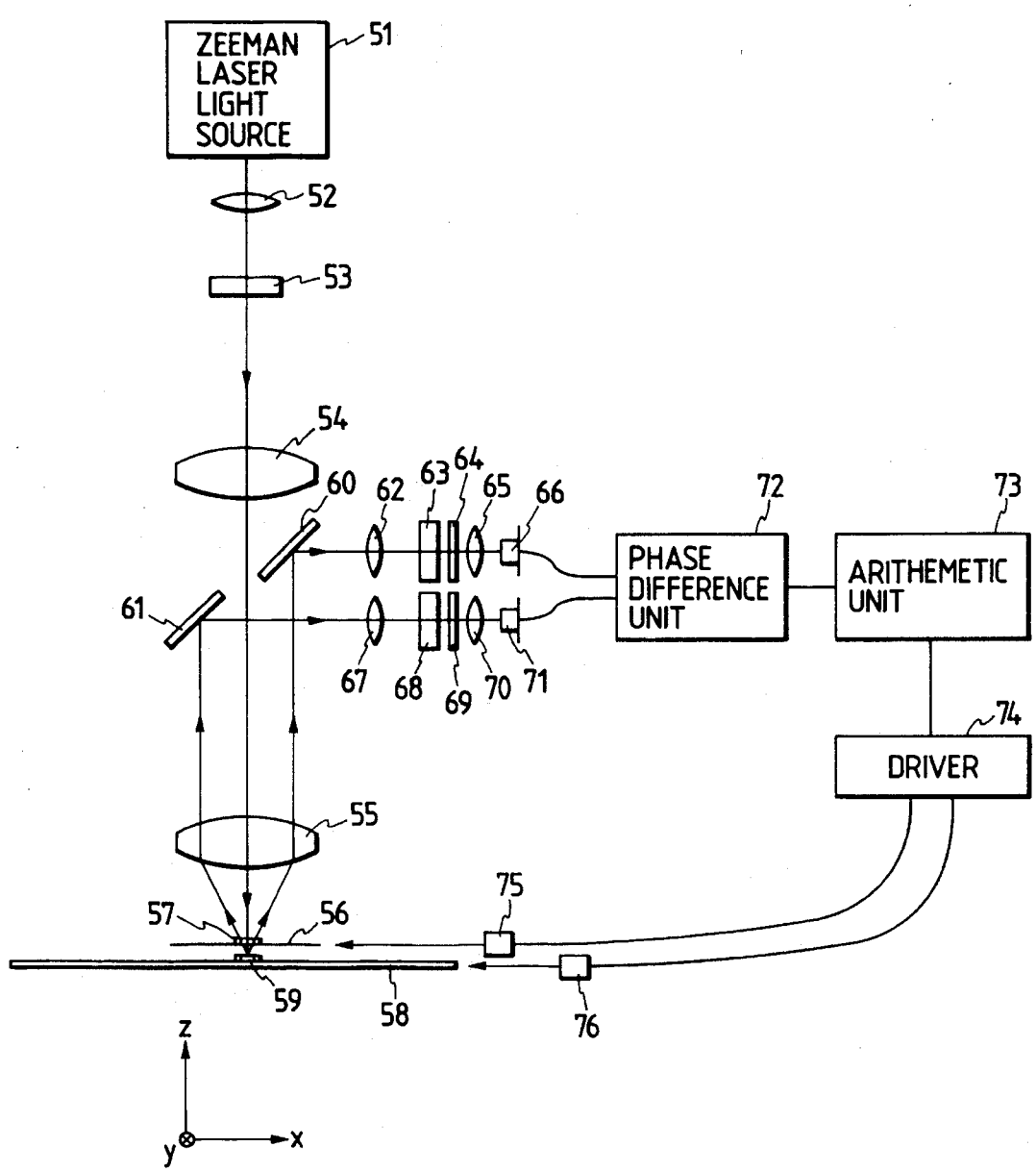
FIG. 1 is the view showing a construction of a first embodiment.

FIG. 1 is a view illustrating the construction of a first embodiment. FIG. 1 shows an alignment unit of a semiconductor manufacturing apparatus of a proximity exposure system using far ultraviolet rays and X-rays. A mask is aligned with a wafer by use of alignment marks consisting of diffraction gratings formed on the mask and the wafer as well.

A lens 52, a Savart plate 53, a lens 54, a lens 55 and an object to be measured are sequentially arranged on the light path of a Zeeman laser light source 51. The object to be measured consists of a diffraction grating 57 formed on the mask 56 and a diffraction grating 59 formed on the wafer 58. Note that the Savart plate 53 composed of a uniaxial crystal body such as, e.g., crystal or calcite which is cut with respect to the optical axis is constructed by cementing together two parallel plates having the same thickness so that principal sections thereof are orthogonal to each other.

Further, the Savart plate 53, the mask 56 and the wafer 58 are so arranged as to be conjugate to the lenses 54, 55. Moreover, mirrors 60, 61 are provided upwardly of the diffraction grating 59. A lens 62, a Savart plate 63, a polarizing plate 64, a lens 65 and a photoelectric detector 66 are sequentially arranged in the reflecting direction of the mirror 60.

Figure 2:
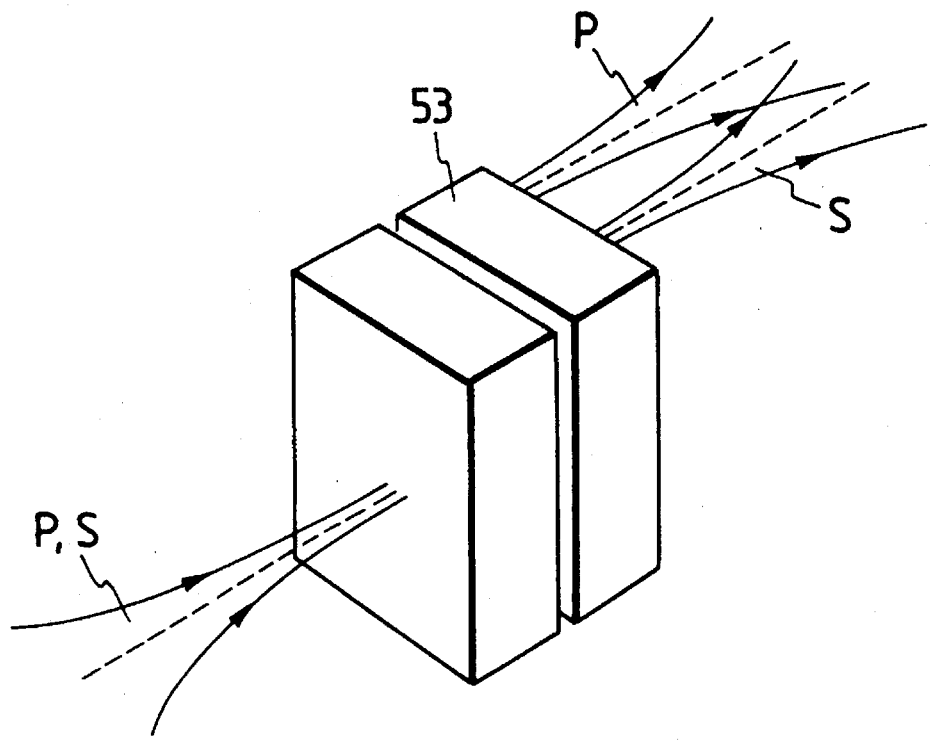
FIG. 2 is an explanatory view showing how beams are split by a Savart plate.

Similarly, a lens 67, a Savart plate 68, a polarizing plate 69, a lens 70 and a photoelectric detector 71 are sequentially arranged in the reflecting direction of the mirror 61. At this time, the Savart plates 63, 68, the mask 56 and the wafer 58 are so arranged as to be conjugate to the lenses 55, 62, 67. Further, outputs of the photoelectric detectors 66, 71 are connected to a phase-difference unit 72 such as a lock-in amplifier or the like. An output of the phase-difference unit 72 is connected to an arithmetic unit 73. Besides, the output of the arithmetic unit 73 is connected via a driver 74 to actuators 75, 76, thereby moving the mask 56 and the wafer 58, respectively. FIG. 2 is an explanatory view of the Savart plate 53. The P-polarized beam and S-polarized beam incident thereon are split at an outgoing face. A distance of this separation is determined by a thickness of the Savart plate 53. Normally, the separation distance is on the order of several 100 μm.

Figure 3:
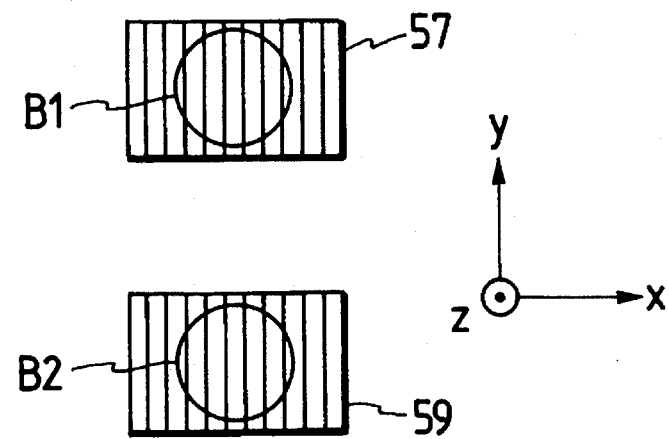
FIG. 3 is a plan view illustrating a mask and a wafer.

The Zeeman laser light source 51 emits the P-polarized light having a frequency f1 and the S-polarized light having a frequency f2. The P- and S-polarized beams are condensed by the lens 52 and incident on the Savart plate 53. The P-and S-polarized beams are thereby split. The outgoing beams from the Savart plate 53 penetrate the lenses 54, 55 constituting an imaging optical system and fall on the diffraction gratings 57, 59. Formed, as illustrated in FIG. 3, are beam spots B1, B2 of the beams having different frequencies and their polarizing directions orthogonal to each other.

There is employed a reduction optical system wherein, for instance, the diameter of the spot of the beam incident on the Savart plate 53 is 400 μm, the separation distance is 500 μm, and a ⅕ powered imaging optical system is provided. The diameter of each of the beam spots B1, B2 on the diffraction gratings 57, 59 is 80 μm. The spacing between the two beam spots B1, B2 is 100 μm. In this case, the y-directional spacing between the diffraction gratings 57, 59 may be set to 100 μm.

Incidentally, FIG. 1 illustrates an example where the beam spots enter the interiors of the diffraction gratings 57, 59. The beam spots B1, B2 are formed so as to swell over to the exteriors of the diffraction gratings 57, 59. Even in this case, no problem is caused, if there is induced no such cross talk that the beam incident on, e.g., the diffraction grating 57, falls on the diffraction grating 59. However, a loss in the light quantity is caused, and hence it is desirable that, as illustrated in FIG. 3, the beam spots B1, B2 be formed inwardly of the diffraction gratings 57, 59.

Figure 4:
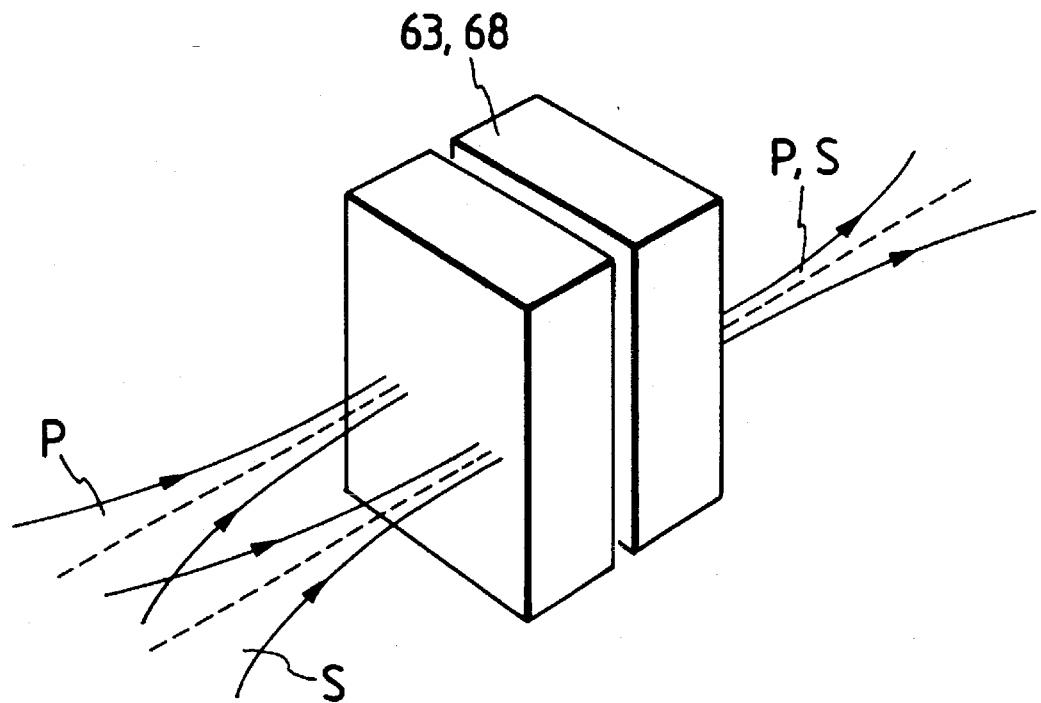
FIG. 4 is an explanatory view showing how the beams are synthesized by the Savart plate.

The ± first-order diffracted beams diffracted by the diffraction gratings 57, 59 are condensed through the lens 55. The + first-order beam is deflected by the mirror 60, while the − first-order beam is deflected by the mirror 61. Thereafter, these beams penetrate the lenses 62, 67 and are incident on the Savart plates 63, 68, respectively. Then, as shown in FIG. 4, the diffracted beams from the diffraction gratings 57, 59 are synthesized per order by the Savart plates 63, 68. Thereafter, these beams are rearranged in terms of the polarizing direction through the polarizing plates 64, 69. The thus rearranged beams are condensed by the lenses 65, 70 and photoelectrically detected by the photoelectric detectors 66, 71.

At this time, an AC component I(+1) of a beat signal of the + first-order diffracted beam detected by the photoelectric detector 66 is expressed by the following formula:

$$I(+1)=A\cdot\cos\{(\omega 2-107\ 1)\cdot t+(\phi b-\phi a)+(\phi 2-\phi 1)\} \quad (5)$$

where A is the amplitude, $\omega 1$, $\omega 2$ are the angular frequencies given by $\omega 1=2\pi\cdot f1$ and $\omega 2=2\pi\cdot f2$, $\phi a$ is the phase added quantity received by the +1st-order diffraction light with an x-directional moving quantity Xa from a fiducial position of the diffraction grating 57, this phase added quantity being given by $\phi a=2\pi\cdot Xa/P$, $\phi b$ is similarly the phase added quantity received by the +1st-order diffraction light of the diffraction grating 59 with an x-directional moving quantity Xb from a fiducial position of the diffraction grating 59, this phase added quantity being given by $\phi b=2\pi\cdot Xb/P$, and further $\phi 1$, $\phi 2$ are the initial phases of the beams having the frequencies f1, f2, respectively.

Expressed similarly by the following formula is an AC component an AC component I(−1) of the beat signal of the − first-order diffracted beams of the diffractions gratings 57, 59, which is detected by the photoelectric detector 71.

$$I(-1)=B\cdot\cos\{(\omega 2-\omega 1)\cdot t+(\phi b'-\phi a')+(\phi 2-\phi 1)\} \quad (6)$$

where B is the amplitude, $\phi a'$ is the phase added quantity received by the − first-order diffracted beam of the diffraction grating 57 with the x-directional moving quantity Xa of the diffraction grating 57, this phase added quantity being given by $\phi a'=-2\pi\cdot Xa/P$, and $\phi b'$ is also the phase added quantity received by the − first-order diffracted beam of the diffraction grating 59 with the x-directional moving quantity Xb of the diffraction grating 59, this phase added quantity being given by $\phi b'=-2\pi\cdot Xb/P$.

The phase difference between the two beat signals expressed by the formulae (5) and (6) is detected by a phase-difference unit 72 and given by:

$$\Delta\phi=(\phi b-\phi a)-(\phi b'-\phi a')=4\pi\cdot(Xb-Xa)/P \quad (7)$$

Figure 5:
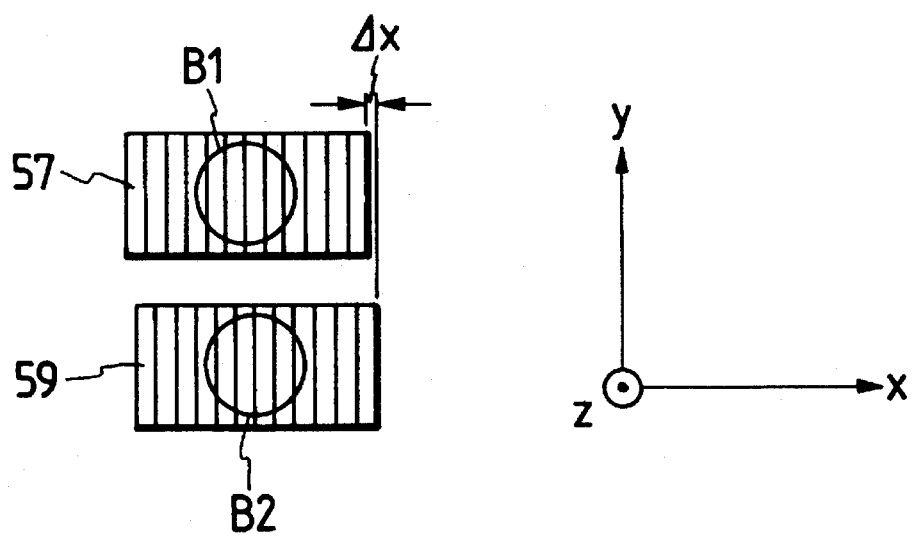
FIG. 5 is an explanatory view showing the positional deviation between a diffraction grating and beam spots.

Namely, the initial phases $\phi 1$, $\phi 2$ are canceled. The phase difference $\Delta\phi$ takes a value proportional to the x-directional relative deviation quantity $\Delta X=Xb-Xa$ between the diffraction gratings 57, 59 as shown in FIG. 5. Hence, the arithmetic unit 73 performs the following calculation, whereby the x-directional relative deviation quantity $\Delta X$ between the diffraction gratings 57, 59 can be obtained from the phase-difference output $\Delta\phi$ of the phase-difference unit 72.

$$\Delta X=\Delta\phi\cdot P/(4\pi) \quad (8)$$

After detecting the positional deviation in this manner, the driver 74 drives the actuators 75, 76 on the basis of the value thereof. At least one of the mask 56 and the wafer 58 is thereby moved so that the deviation quantity becomes an allowable value or smaller. It is thus possible to align the mask 56 with the wafer 58 with high accuracy.

Figure 6:
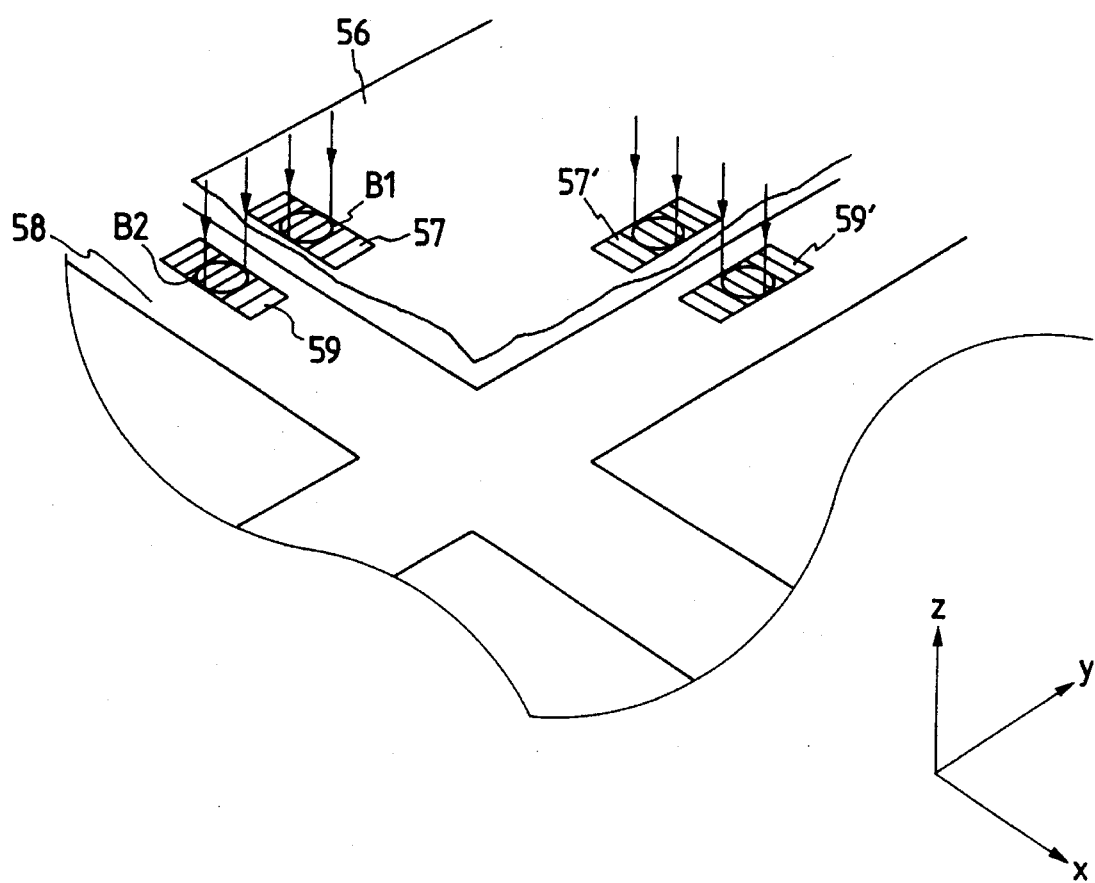
FIG. 6 is an enlarged view illustrating the mask and the wafer.

The explanation given for this embodiment has emphasized on only the x-directional alignment. A y-directional alignment can be, however, conducted the same as the x-directional alignment. This involves the step of respectively providing, as illustrated in FIG. 6, the mask 56 and the wafer 58 with other alignment marks in a direction orthogonal to the x-directional alignment marks. Further, another optical system is provided in a direction orthogonal to the x-directional detection optical system.

Besides, the measurement is performed by use of the ± nth-order diffracted beams in this embodiment. Higher-order, i.e., second- and third-order diffracted beams may also be employed. In the case of using ± nth-order diffracted beams, the sensitivity of the phase difference detected by the phase-difference unit 72 is n times, whereas the dynamic range is 1/n.

<Embodiment 2>

Figure 7:
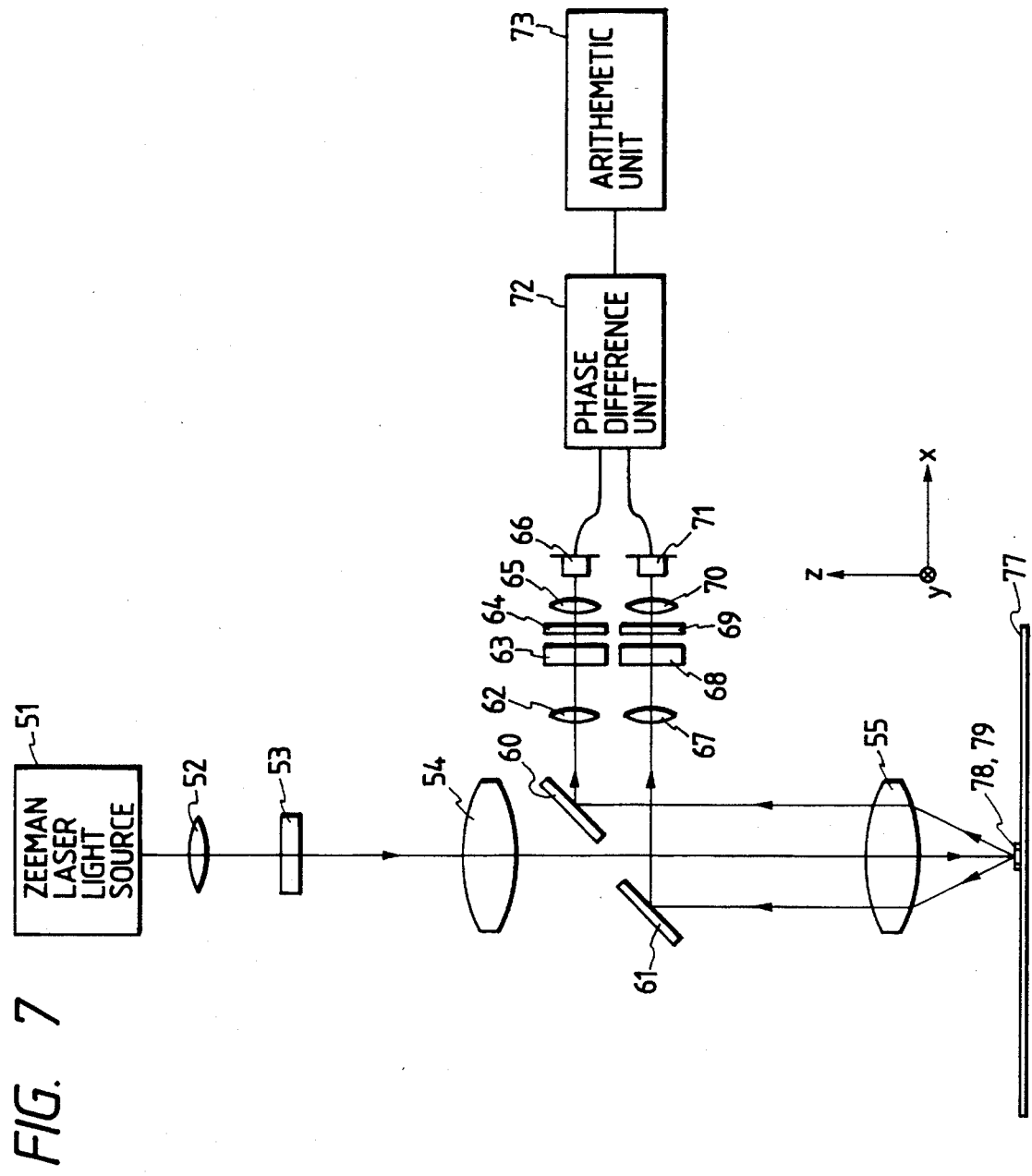
FIG. 7 is the view illustrating a construction in a second embodiment.

FIG. 7 is a view illustrating the construction of a second embodiment. Shown therein is a printing overlay evaluation device for highly accurately detecting and evaluating the positional deviation between two printing overlay evaluation patterns printed by two shots of exposure. Note that the same numerals as those in FIG. 1 indicate the identical members. A wafer 77 is disposed in the transmitting direction of the lens 55 from the Zeeman laser light source 51. Diffraction gratings 78, 79 are formed on the wafer 77 by separate printing processes. At this time, the Savart plate 53 and the wafer are so arranged as to be conjugate to the lenses 54, 55.

The light emitted from the Zeeman laser light source 51 enters the Savart plate 53 via the lens 52. The light is, after being split into two beams, incident on the diffraction gratings 78, 79. Formed then on the diffraction gratings 78, 79 are beam spots B3, B4 of the beams having different frequencies and their polarization planes orthogonal to each other.

Figure 8:
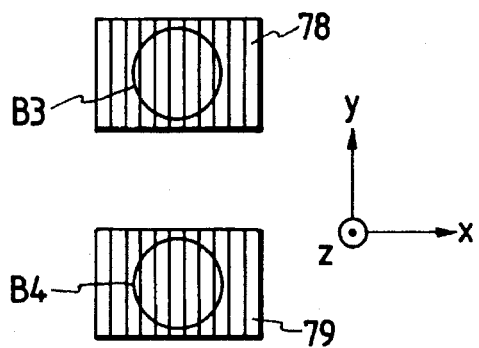
FIG. 8 is a plan view showing the mask and the wafer.

Incidentally, as in the first embodiment, the beam spots B3, B4 are formed to swell over to the exteriors of the diffraction gratings 78, 79. Even in this case, a problem is not caused if there is produced no such cross talk that the beam to be incident on the diffraction grating 78 falls on the diffraction grating 79. For the purpose of restraining a loss in the light quantity and eliminating the influence by an in-beam wavefront aberration, however, it is desirable that the beam spots B3, B4 be formed inwardly of the diffraction gratings 78, 79 as shown in FIG. 8.

Hereafter, the phase difference between two beat signals is detected by the phase-difference unit 72 in accordance with the same procedures as those in the first embodiment. The calculation expressed in the formula (8) is performed by an arithmetic unit 12, thereby making it possible to obtain the relative deviation quantity between the two diffraction gratings 78, 79. Further, the deviation quantity between the pattern printed first time and the pattern printed second time is obtained based on the above-mentioned principle. It is thus possible to effect the printing overlay evaluation in the semiconductor exposure apparatus.

<Embodiment 3>

Figure 9:
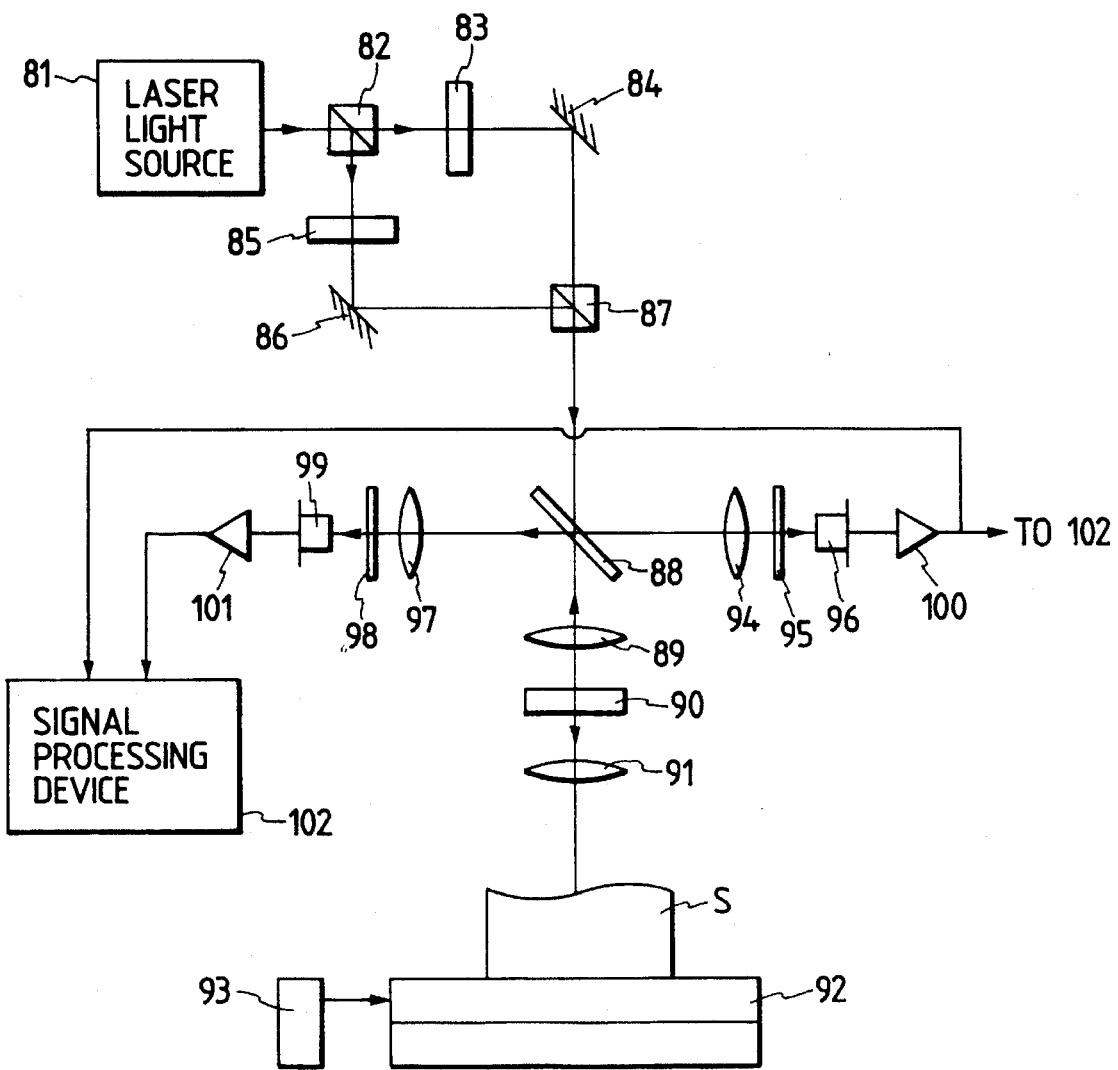
FIG. 9 is the view illustrating a construction of a third embodiment.

FIG. 9 is a view of the construction of a third embodiment but shows a surface configuration measuring device. A polarized beam splitter 82, a frequency modulator 83 and a mirror 84 are sequentially arranged on the light path of a laser light source 81. A frequency modulator 85 and a mirror 86 are arranged in the reflecting direction of the polarized beam splitter 82. A polarized beam splitter 87 is provided in the reflecting direction of the mirrors 84, 86. A half-mirror 88, a lens 89, a Savart plate 90, a lens 91 and an XY-stage 92 are sequentially arranged on the synthetic light path extending from the polarized beam splitter 87. At this time, the Savart plate 90 and an object S to be measured are so disposed as to be conjugate to the lens 91.

The object S to be measured is also disposed on the XY-stage 92 connected to a driving unit 93 such as a motor or the like. Further, a lens 94, a polarizing plate 95 and a photoelectric detector 96 are sequentially arranged in the reflecting direction of the half-mirror 88. A lens 97, a polarizing plate 98 and a photoelectric detector 99 are also sequentially arranged in the direction opposite to the photoelectric detector 96 with respect to the half-mirror 88. Outputs of the photoelectric detectors 96, 99 are connected to a signal processing device 102 via amplifiers 100, 101.

Figure 10:
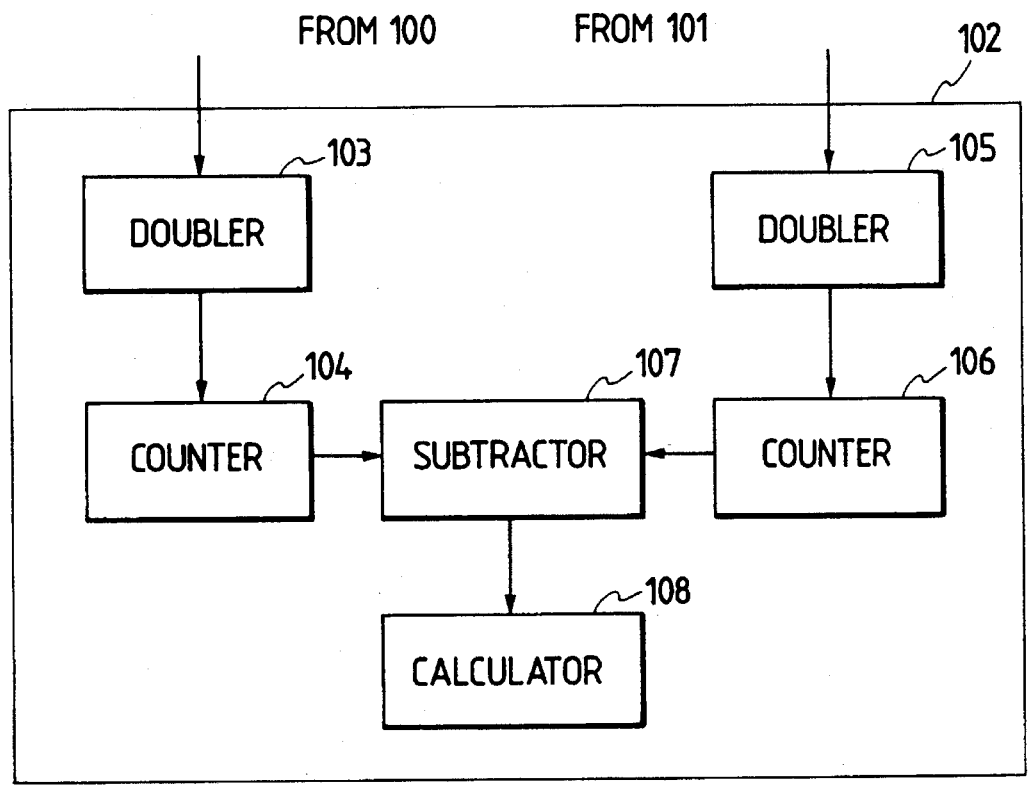
FIG. 10 is a view showing a construction of a signal processing unit.

FIG. 10 is a view illustrating the construction of the signal processing device 102 described above. An output of the amplifier 100 is connected via a doubler 103 to a counter 104. The output of the amplifier 101 is connected via a doubler 105 to a counter 106. Further, outputs of the counters 104, 106 are connected to a subtracter 107. The output of the subtracter 107 is connected to a calculator 108.

The light emitted from the laser light source 81 is split into beams by means of the polarized beam splitter 82 and frequency-modulated to have frequencies f1, f2 slightly different from each other through the frequency modulators 83, 85. The beams are thereafter resynthesized by the polarized beam splitter 87. It follows that two beams, i.e., the P-polarized beam having the frequency f1 and S-polarized beam having the frequency f2 travel on the same light path. These beams are split in two directions by the half-mirror 88. The beams reflected therefrom are condensed by the lens 94 and, after rearranging their polarization planes through the polarizing plate 95, interfere with each other. The photoelectric detector 96 detects the thus Generated beat signal having a frequency (f2–f1). This beat signal is amplified by the amplifier 100 and inputted as a reference beat signal to the signal processing device 102.

Figure 11:
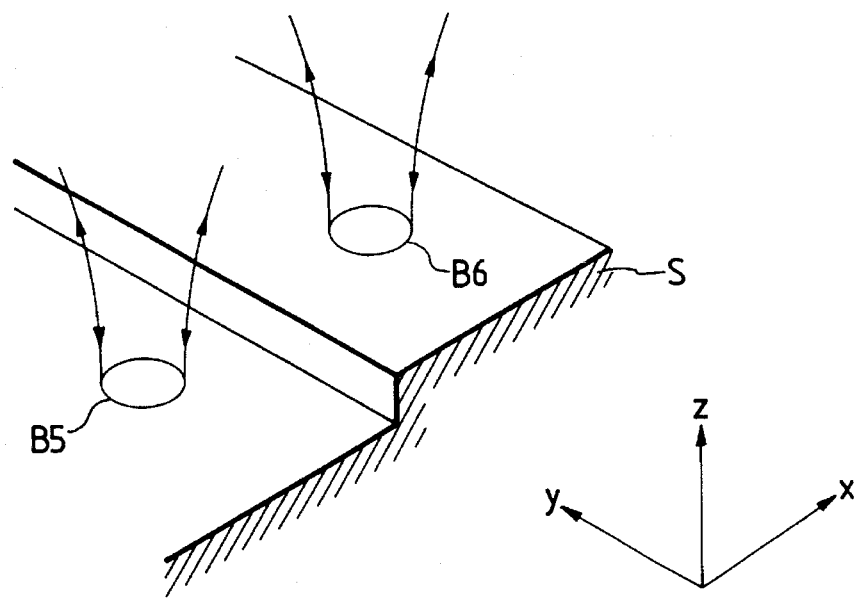
FIG. 11 is an explanatory view showing the beams spots.

While on the other hand, the beams penetrating the half-mirror 88 are condensed by the lens 89 and fall on the Savart plate 90. The beams incident on the Savart plate 90 are, as illustrated in FIG. 2, split into a P-polarized beam having the frequency f1 and an S-polarized beam having the frequency f2. As shown in FIG. 11, the beams falls on the surface of the object S to be measured, thus forming two spots B5, B6. The beams reflected from the surface of the object S to be measured are incident on the Savart plate 90 via the lens 91. The beams having the frequencies f1, f2 are re-synthesized and travel on the same light path. These beams are collimated into parallel beams through the lens 89. The parallel beams are, after being reflected by the half-mirror 88, condensed by the lens 97. Further, these beams are rearranged in terms of the polarizing direction by the polarizing plate 98. Then, the interference takes place, thereby generating the beat signal.

In this beat signal, as illustrated in FIG. 11, there appears, in the form of a phase variation quantity, a piece of information about the relative rugged configuration on the surface of the object S to be measured between positions of the beam spots B5, B6. This beat signal is detected by the photoelectric detector 99 and amplified by the amplifier 101. This signal is inputted as a measurement beat signal to the signal processing device 102. The object S to be measured is moved by driving the XY-stage 92 from the driving unit 93. A measurement beam having the frequency f1 which has been reflected by the object S to be measured undergoes a Doppler shift fd1, with the result that the frequency becomes f1+fd1. This Doppler shift fd1 corresponds to a phase change in the measurement beam per unit time with a change in length of the light path due to the ruggedness in an area B5 of FIG. 11. Similarly, the measurement beam having the frequency f2 undergoes a Doppler shift fd2, with the result that the frequency becomes f2+fd2. This Doppler shift fd2 corresponds to a phase change in an area B6.

Hence, the measurement beat signal has a beat frequency equivalent to the difference between the frequencies of the two measurement beams, i.e., given by (f1–f2)–(fd1–fd2). The reference beat signal of these signal is inputted to the doubler 103 and the counter 104. The measurement beat signal is inputted to the doubler 105 and the counter 106. Thereafter, the difference between the two beat frequencies is obtained by the subtracter 49.

Herein, the XY-stage 92 is moved at a velocity V in the y-direction shown in FIG. 11. Frequency shifts to which the areas B5, B6 are subjected are expressed by the following formulae:

$$fd1 = Vz1 \cdot (2/\lambda) = (\Delta Z1/\Delta t) \cdot (2/\lambda) \tag{9}$$

where Vz1 is the z-directional displacement velocity of the rugged portion in the area B5 on the surface of the object S to be measured with the movement of the XY-stage 92, and Vz2 is the z-directional displacement velocity of the rugged portion in the area B6; and $$fd2 = Vz2 \cdot (2/\lambda) = (\Delta Z2/\Delta t) \cdot (2/\lambda) \tag{10}$$

where $\Delta Z1$, $\Delta Z2$ are the z-directional displacement quantities of the areas B5, B6, and $\lambda$ is the wavelength. Accordingly, the z-direction displacement difference $\Delta Z$ between the areas B5, B6 is obtained from the output N of the subtracter 107 by means of the calculator 108 and expressed such as:

$$\Delta Z = \Delta Z2 - \Delta Z1 = (\lambda/2) \cdot (fd2 - fd1) \cdot dt = (\lambda/2) \cdot N \tag{11}$$

The z-directional resolving power is given by $\lambda/2$ from the formula (11). However, a resolving power on the order of $\lambda/128$ can be obtained owing to the doublers 103, 105.

Inputted to the calculator 108 are pieces of positional information of the object E to be measured in which $\Delta Z$ is detected by the method such as an interferometer or the like in all the positions where the object S to be measured is thus moved through the XY-stage 92 and measured. The ruggedness on the surface can be thereby measured.

Note that the surface ruggedness takes a mean value within the beam spots, and, hence, it is desirable that diameters of the beam spots B5, B6 be reduced to enhance the crosswise resolving power.

<Embodiment 4>

Figure 12:
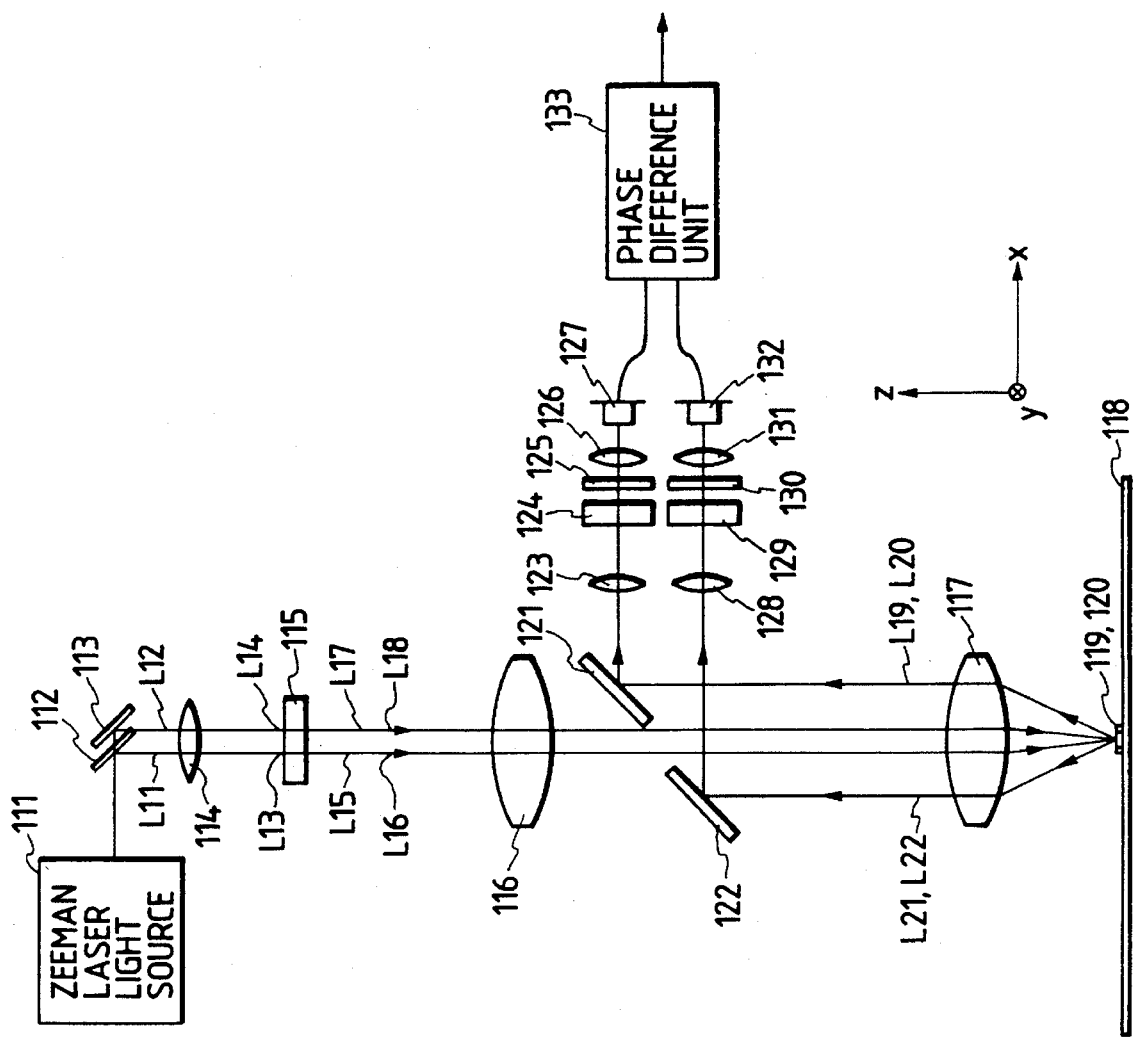
FIG. 12 is the view illustrating a construction of a fourth embodiment.

FIG. 12 is a view showing the construction of a fourth embodiment. A half-mirror 112 and a mirror 113 are sequentially arranged close to each other on the light path of a Zeeman laser light source 111. A lens 114, a Savart plate 115, a lens 116, a lens 117 and a wafer 118 are sequentially arranged in the reflecting direction of the half-mirror 112 and the mirror 113. Diffraction gratings 119, 120 are formed on the wafer 1118. At this time, the Savart plate 115 is disposed in a focal position of the lens 114. The Savart plate 115 and the diffraction gratings 119, 120 are so disposed as to be conjugate to the lenses 116, 117.

Mirrors 121, 122 are provided upwardly of the wafer 118, whereby the + and − first-order diffracted beams are deflected. A lens 123, a Savart plate 124, a polarizing plate 125, a lens 126 and a photoelectric detector 127 such as, e.g., an avalanche photo diode are sequentially arranged in the reflecting direction of the mirror 121. Similarly, a lens 128, a Savart plate 129, a polarizing plate 130, a lens 131 and a photo detector 132 are sequentially arranged in the reflecting direction of the mirror 122. Note that the axes of polarization of the polarizing plates 125, 130 are set at an angle of 45° with respect to the polarizing directions orthogonal to each other. Further, outputs of the photoelectric detectors 127, 132 are connected to a phase-difference unit 133 such as a lock-in amplifier or the like.

Figure 13:
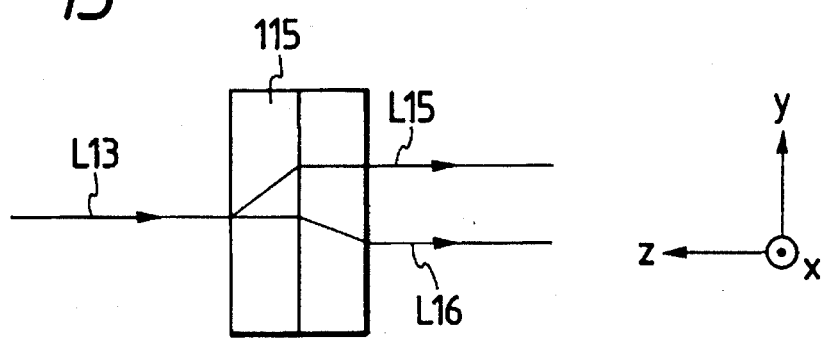
FIG. 13 is an explanatory view showing a splitting function of the Savart plate.

The Zeeman laser light source 11 emits the P-polarized beam having the frequency f1 and Z-polarized beam having the frequency f2. These beams have a wavelength of 6328 angstroms, and a frequency difference $\Delta f = |f1-f2|$ is 0.1–2 MHz. These beams are split into two beams L11, L12 by the half-mirrors 112, 113. The beams L11, L12 are condensed by the lens 114 and turn out L13, L14. The beams L13, L14 fall on the Savart plate 115. The beams L13, L14 are, as illustrated in FIG. 13, split into beams having only the P- or S-polarized light. The beam L13 is subsplit into a beams L15, L16. The beam L14 is subsplit into beams L17, L18. At this time, the beams L15, L16, L17, L18 are diffracted by the diffraction gratings 119, 120. The beams L15, L16 become beams L19, L20. The beams L17, L18 turn out beams L21, L22. These beams again fall on the lens 117.

Figure 14:
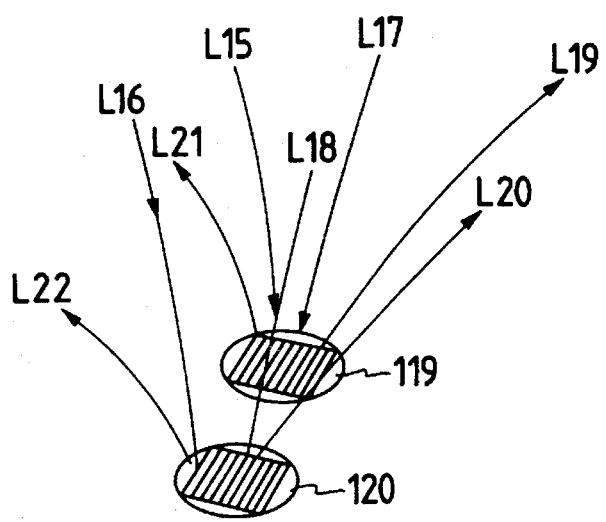
FIG. 14 is an explanatory view showing beams relative to the diffraction gratings on the wafer.
Figure 15:
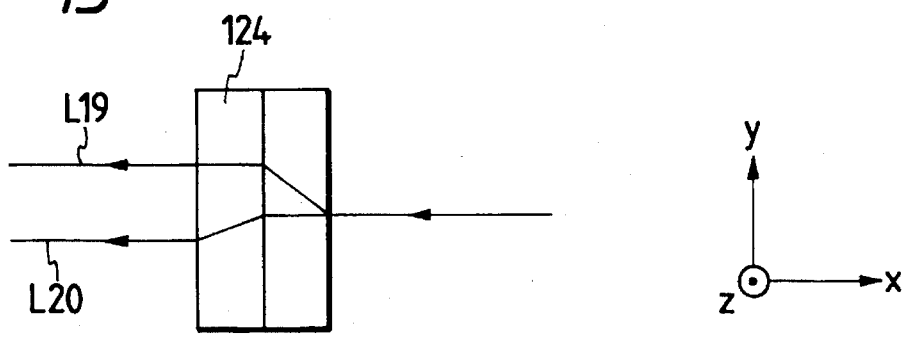
FIG. 15 is an explanatory view showing a synthesizing function of the Savart plate.
Figure 16:
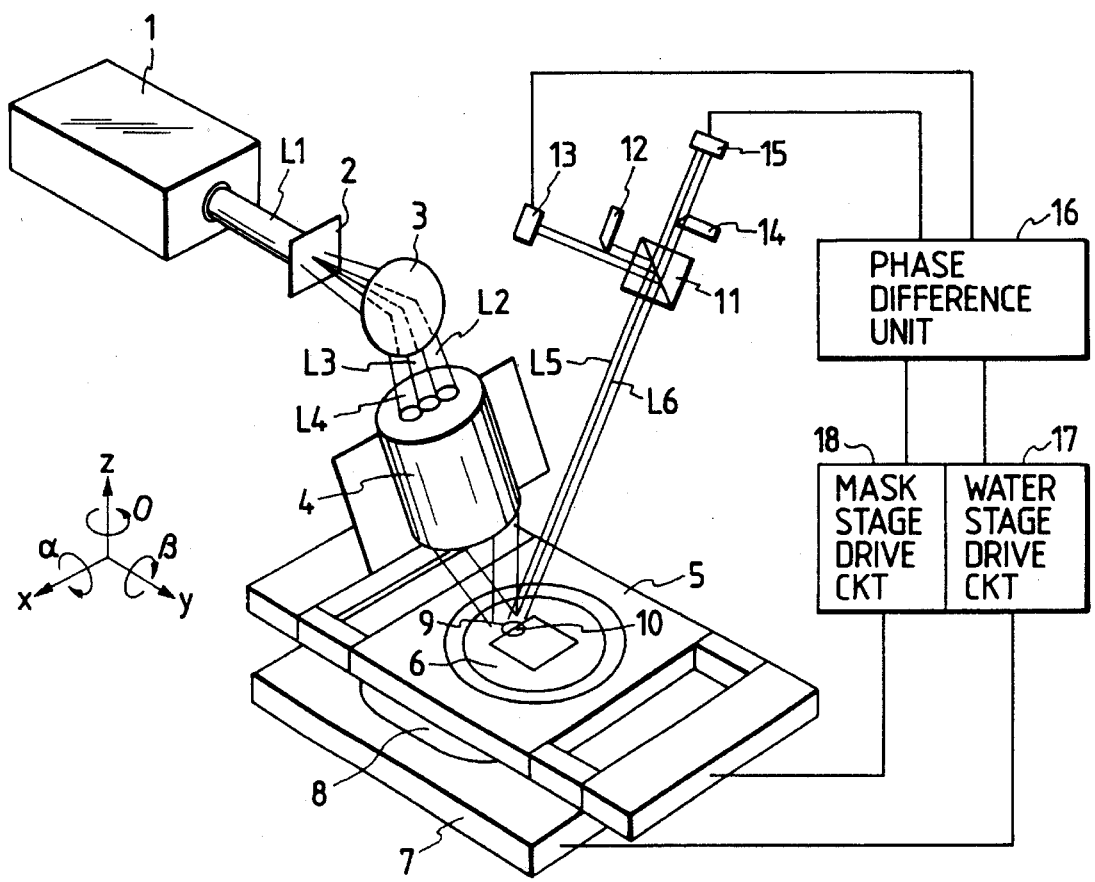
FIG. 16 is the view showing a construction of a conventional example.
Figure 17:
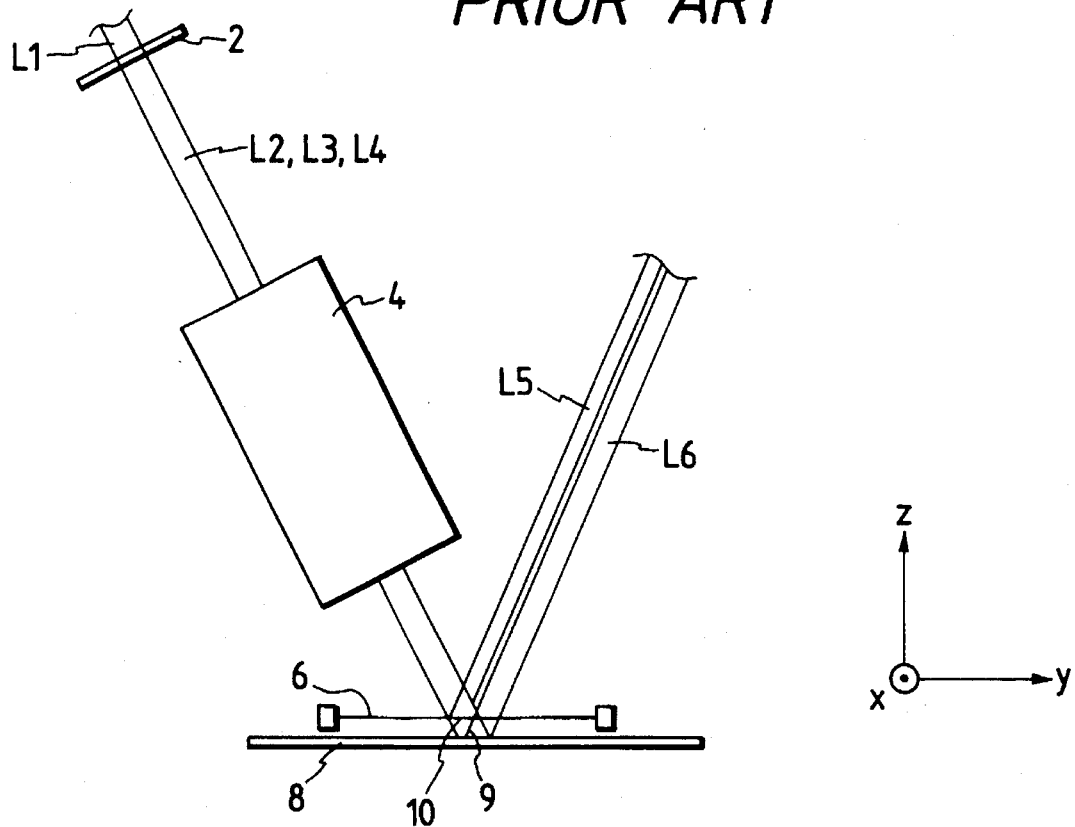
FIG. 17 is an explanatory view showing how the beams are split.
Figure 18:
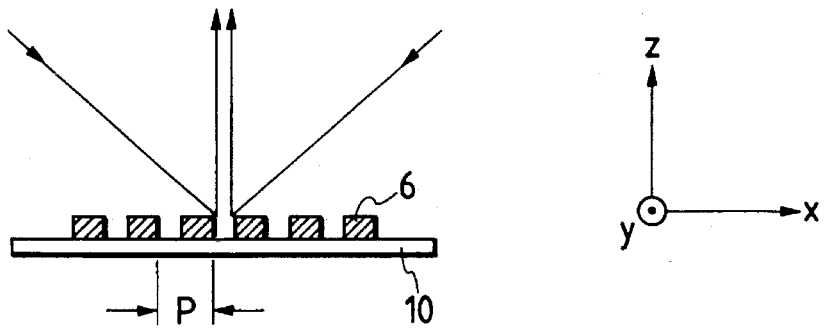
FIG. 18 is an explanatory view showing the diffraction by the diffraction grating in the conventional example.
Figure 19:
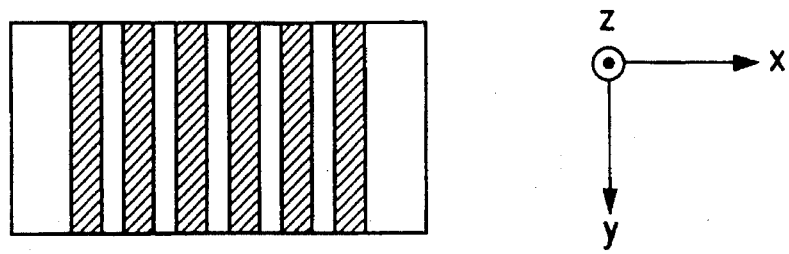
FIG. 19 is a plan view illustrating a diffraction grating.
Figure 20:
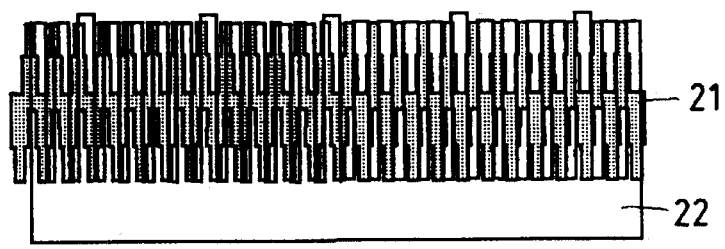
FIG. 20 is a plan view illustrating a state where two patterns are overlaid.
Figure 21:
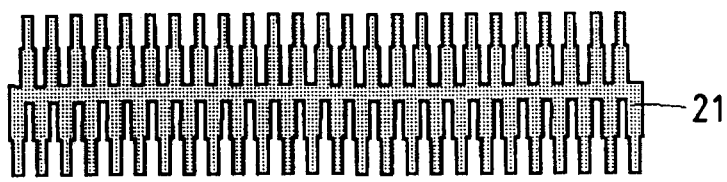
FIG. 21 is a plan view showing the patterns.
Figure 22:
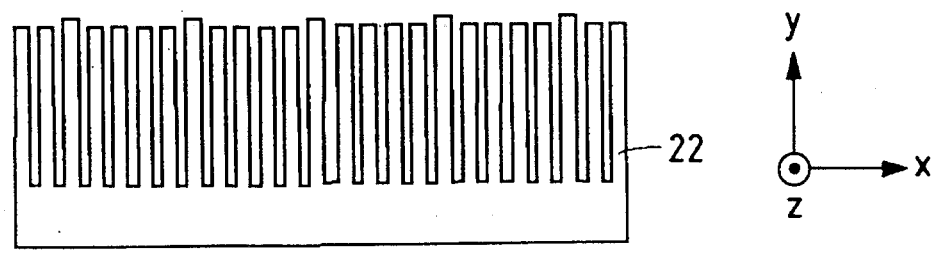
FIG. 22 is a plan view illustrating the patterns.

FIG. 14 is an explanatory view showing the diffractions caused by the diffraction gratings 119, 120. The beams L19, L20 are deflected by the mirror 121 and incident on the Savart plate 124 through the lens 123. These beams are re-synthesized as shown in FIG. 15. After rearranging the polarizing directions thereof through the polarizing plate 125, the interference takes place. The beams are condensed by the lens 126 and detected by the photoelectric detector 127. Similarly, the beams L21, L22 are synthesized by the Savart plate 129 through the mirror 122 and the lens 128. The beams are rearranged in terms of the polarization plane by the polarizing plate 130 and, after causing the interference, detected by the photoelectric detector 132. Outputs of the photoelectric detectors 127, 132 are inputted to the phase-difference unit 133 to detect a phase difference. A positional deviation in the x-direction between the diffraction gratings 119, 120 on the wafer 118 can be thereby measured at a high accuracy.

Note that the Savart plates 124, 129 are separate. However, the signal Savart plate may be employed. Further, this embodiment has dealt with the positional deviation between the plurality of diffraction gratings on the wafer 118. The present embodiment is, however, applicable to the positional deviation between two objects such as, e.g., the mask and the wafer.

Further, in the overlay evaluation device as well as in the alignment device of the semiconductor manufacturing apparatus shown by way of an applied example of the present invention, the beam spots can be formed inwardly of the diffraction gratings. This produces the effect of undergoing no influence by unnecessary scattered light from the IC patterns or the like.

<Embodiment 5>

Figure 24:
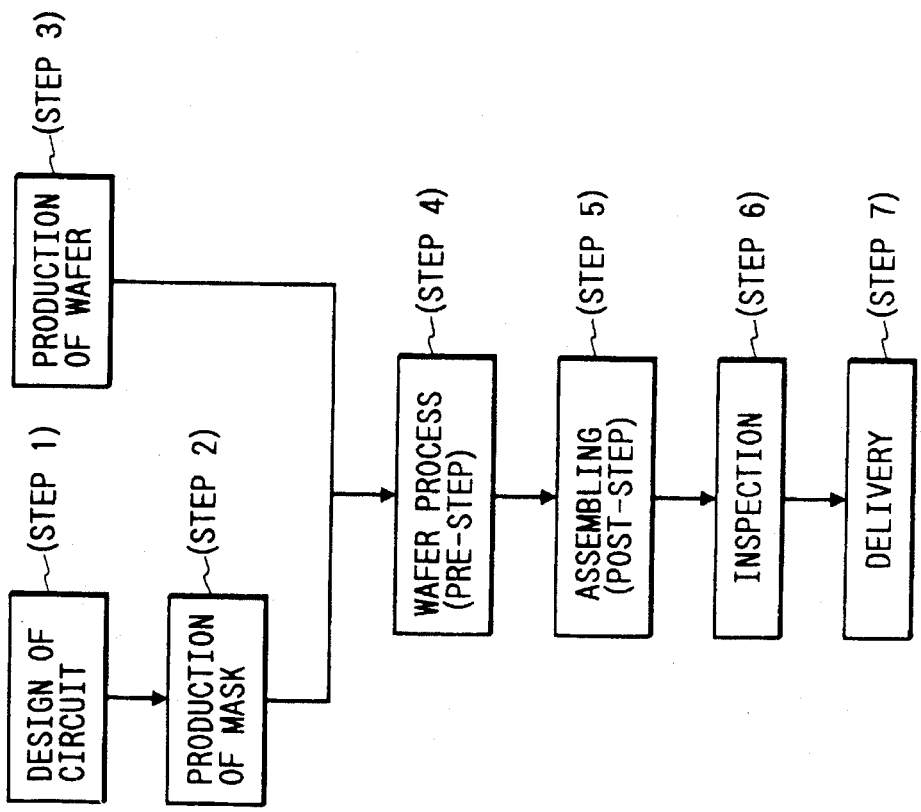
FIG. 24 is a flowchart showing a flow of actions to manufacture a device.

The following is an explanation of an embodiment of a device manufacturing method to which the apparatus discussed above is applied. FIG. 24 is a flowchart showing a flow of actions to manufacture microdevices (semiconductor chips of IC and LSI or the like, a liquid crystal panel, a CCD, a thin film magnetic head, a micromachine, etc.). A circuit of a semiconductor device is designed in step 1 (circuit design). A mask formed with a pattern of the designed circuit is produced in step 2 (production of mask). On the other hand, a wafer is produced by use of a material such as silicon or the like in step 3 (production of wafer). In step 4 (wafer process) termed a pre-step, an actual circuit is formed on the wafer by a lithography technique in combination with the above-mentioned mask and the wafer prepared. In next step 5 (assembly) called a post-step, a transformation into the semiconductor chip is effected by using the wafer manufactured in step 4. This step includes an assembly step (dicing, bonding), a packaging step (chip sealing), and the like. In step 6 (inspection), there are performed inspections such as an operation confirming test and a durability test of the semiconductor device manufactured in step 5. The semiconductor device is completed through these steps and delivered (step 7).

Figure 25:
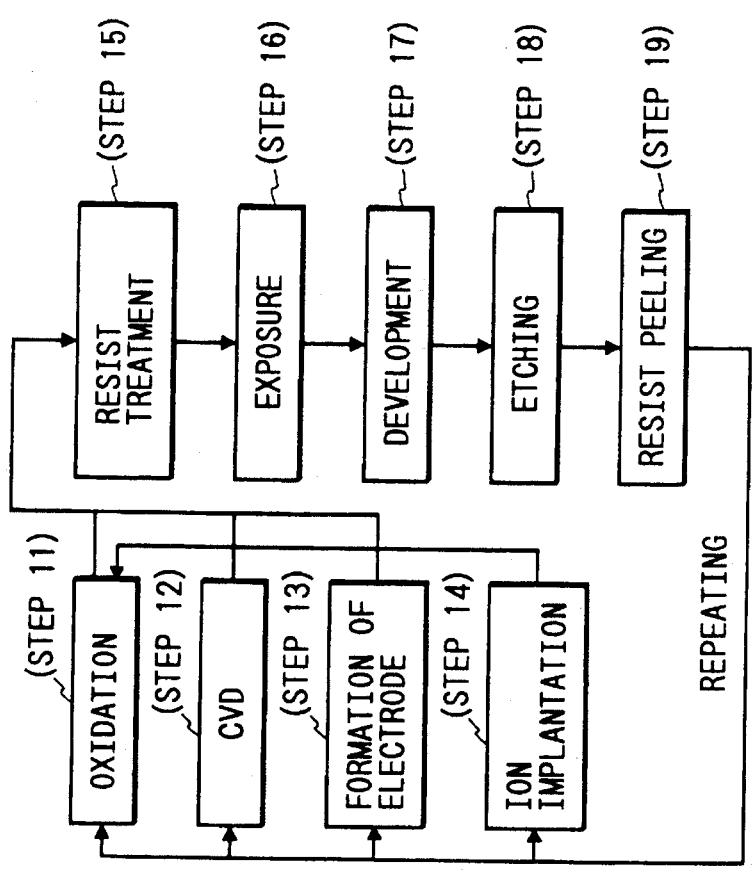
FIG. 25 is a flowchart showing a detailed flow of a wafer process.

FIG. 25 is a flowchart fully showing the wafer process described above. The wafer surface is oxidized in step 11 (oxidation). An insulating film is formed on the wafer surface in step 12 (CVD). An electrode is formed by vapor deposition on the wafer in step 13 (formation of electrode), Ions are implanted into the wafer in step 14 (ion implantation). A photosensitive agent is coated on the wafer in step 15 (resist treatment). The mask is precisely aligned with the wafer by use of the apparatus explained above, and the circuit pattern of the mask is print-exposed on the wafer in step 16 (exposure). The exposed wafer is developed in step 17 (development). Portions other than the developed resist image are cut off in step 18 (etching). The resist unnecessary after being etched is peeled off in step 19 (resist peeling). The circuit patterns are multi-layered on the wafer by repeating these steps. According to the manufacturing method in this embodiment, it is possible to manufacture the semiconductor device with a high integration degree which has hitherto been hard to manufacture.

It is apparent that, in this invention, a wide range of different working modes can be formed based on the invention without deviating from the spirit and scope of the invention. This invention is not restricted by its specific working modes except being limited by the appended claims.

What is claimed is:

1. A method of detecting the relative positional deviation between two diffraction gratings, said method comprising the steps of:

splitting a light beam into two light beams;

causing one of the two light beams to enter one of the two diffraction gratings, and causing the other light beam to enter the other diffraction grating;

causing +nth-order diffracted beams diffracted by the two diffraction gratings to interfere with each other, and causing −nth-order diffracted beams diffracted by the two diffraction gratings to interfere with each other, thereby forming two interference signals; and detecting the relative positional deviation between the two diffraction gratings on the basis of the two interference signals.

2. A method according to claim 1, wherein said splitting step includes the step of causing the one light beam to enter a Savart plate.

3. A method according to claim 2, wherein the two diffraction gratings and the Savart plate are disposed so as to be optically conjugate.

4. A method according to claim 1, wherein the one light beam includes polarized light beams orthogonal to each other and having different frequencies.

5. A method according to claim 1, wherein each interference signal is a beat signal, and said detecting step includes the step of detecting a phase difference between the two beat signals.

6. A method according to claim 1, wherein one diffraction grating is formed on a mask, and the other diffraction grating is formed on a wafer.

7. A method according to claim 1, wherein the two diffraction gratings are formed on a substrate by processes different from each other.

8. A method according to claim 1, wherein the +nth-order diffracted beams are mixed and the −nth-order diffracted beams are mixed by a Savart plate, thereby forming the interference signals, respectively.

9. An apparatus according to claim 1, wherein said detecting means includes a Savart plate for mixing the +nth-order diffracted beams and mixing the −nth-order diffracted beams to form the interference signals, respectively.

10. An apparatus for detecting the relative positional deviation between two diffraction gratings, said apparatus comprising:

a light source for emitting light;

means for splitting a light beam from said light source into two light beams;

means for detecting two interference signals by causing one of the two light beams to enter one of the two diffraction gratings and the other light beam to enter the other of the two diffracting gratings, causing +nth-order diffracted beams diffracted by the two diffraction gratings to interfere with each other to form one interference signal, and causing the −nth-order diffracted beams diffracted by the two diffraction gratings to interfere with each other to form another interference signal; and means for measuring the relative positional deviation between the two diffraction gratings on the basis of the two interference signals from said detecting means.

11. An apparatus according to claim 10, wherein said splitting means includes a Savart plate.

12. An apparatus according to claim 10, wherein the two diffraction gratings and said Savart plate are disposed so as to be optically conjugate.

13. An apparatus according to claim 10, wherein the one light beam includes polarized light beams orthogonal to each other and having different frequencies.

14. An apparatus according to claim 10, wherein each interference signal is a beat signal, and said measuring means includes means for detecting a phase difference between the two beat signals.

15. An apparatus according to claim 10, wherein one diffraction grating is formed on a mask, and said other diffraction grating is formed on a wafer.

16. An apparatus according to claim 10, wherein the two diffraction gratings are formed on a substrate by processes different from each other.

* * * * *

UNITED STATES PATENT AND TRADEMARK OFFICE
CERTIFICATE OF CORRECTION

PATENT NO. : 5,465,148
DATED : November 7, 1995
INVENTOR(S) : TAKAHIRO MATSUMOTO, ET AL.

Page 1 of 2

It is certified that error appears in the above-indentified patent and that said Letters Patent is hereby corrected as shown below:

SHEET 7 OF THE DRAWINGS

Figure 10,

"SUBTRACTOR" should read --SUBTRACTER--.

Column 2, line 67, "so-so that called" should read --so that so-called--.

Column 3, line 24, "patters 22" should read --patterns 22--.
line 29, "Splitter" should read --splitter--.
line 45, "of" should be deleted".
line 64, "interfered" should read --interfere--.

Column 4, line 14, "This," should read --Thus,--, and "a" should be deleted.
line 17, "method this" should read --this method--.
line 19, "such" should be deleted".
line 44, "are" should be deleted.

Column 5, line 5, "are" should be deleted.
line 24, "in" should read --of--.

UNITED STATES PATENT AND TRADEMARK OFFICE
CERTIFICATE OF CORRECTION

PATENT NO. : 5,465,148
DATED : November 7, 1995
INVENTOR(S) : TAKAHIRO MATSUMOTO, ET AL.

It is certified that error appears in the above-indentified patent and that said Letters Patent is hereby corrected as shown below:

<u>Column 6,</u> line 21, "10" should be deleted.

<u>Column 7,</u> line 23, "($\omega$2-107 1)" should read --($\omega$2-$\omega$1)--.
line 38, "an AC component" should be deleted.

<u>Column 9,</u> line 41, "Generated" should read --generated--.
line 50, "falls" should read --fall--.

<u>Column 11,</u> line 2, "wafer 1118." should read --wafer 118.--.
line 29, "a" should be deleted.

Signed and Sealed this

Thirtieth Day of April, 1996

Attest:

BRUCE LEHMAN

*Attesting Officer*   *Commissioner of Patents and Trademarks*

UNITED STATES PATENT AND TRADEMARK OFFICE
CERTIFICATE OF CORRECTION

PATENT NO. : 5,465,148
DATED : November 7, 1995
INVENTOR(S) : Takahiro Matsumoto, et al.

It is certified that error appears in the above-indentified patent and that said Letters Patent is hereby corrected as shown below:

Column 13, line 13, "1" should read --10--.

Signed and Sealed this

Sixth Day of August, 1996

Attest:

BRUCE LEHMAN

Attesting Officer    Commissioner of Patents and Trademarks